United States Patent

Wajda

[15] 3,660,180

[45] May 2, 1972

[54] CONSTRAINMENT OF AUTODOPING IN EPITAXIAL DEPOSITION

[72] Inventor: Edward S. Wajda, Poughkeepsie, N.Y.

[73] Assignee: International Business Machines Corporation, Armonk, N.Y.

[22] Filed: Feb. 27, 1969

[21] Appl. No.: 802,810

[52] U.S. Cl. ..............................148/175, 117/106, 117/201, 117/213, 148/1.5, 148/174, 204/192, 317/234 R

[51] Int. Cl. .....................H01l 7/36, C23c 11/00, H01l 5/00

[58] Field of Search ...................148/174, 175, 1.5; 204/192, 204/298; 117/106, 107.2, 201, 213, 215; 317/234, 235

[56] References Cited

UNITED STATES PATENTS

| | | | |
|---|---|---|---|
| 3,404,450 | 10/1968 | Karcher | 29/577 |
| 2,886,502 | 5/1959 | Holland | 204/192 |
| 3,021,271 | 2/1962 | Wehner | 204/298 X |
| 3,170,825 | 2/1965 | Schaarschmidt | 148/175 |
| 3,206,322 | 9/1965 | Morgan | 204/192 X |
| 3,208,888 | 9/1965 | Ziegler et al. | 148/175 |
| 3,494,809 | 2/1970 | Ross | 148/175 |
| 3,522,164 | 7/1970 | Sumner | 148/175 X |

FOREIGN PATENTS OR APPLICATIONS

| | | | |
|---|---|---|---|
| 986,403 | 3/1965 | Great Britain | 148/175 |
| 1,099,098 | 1/1968 | Great Britain | 148/175 |

OTHER PUBLICATIONS

AIME Publication, Metallurgy of Semiconductor Materials, Aug. 30– Sept. 1, 1961, Vol. 15, pp. 87– 93

Doo, V. Y. et al. " Growing High Resistivity Epitaxial Films on Low Resistivity Silicon Substrates" IBM Tech. Disclosure Bulletin, Vol. 5, No. 2, July 1962, pp. 50– 51.

Kahng, D., et al. " Epitaxial Silicon Junctions" Journal of the Electrochemical Soc. Vol. 110, No. 5, May 1963, pp. 394–400.

*Primary Examiner*—L. Dewayne Rutledge
*Assistant Examiner*—W. G. Saba
*Attorney*—Hanifin and Jancin and Henry Powers

[57] ABSTRACT

Autodoping is minimized during epitaxial deposition by sputtering a primary or initial film on a doped semiconductor substrate prior to epitaxial deposition.

6 Claims, 4 Drawing Figures

INVENTOR
EDWARD S. WAJDA

BY

ATTORNEY

CONSTRAINMENT OF AUTODOPING IN EPITAXIAL DEPOSITION

1. Field of the Invention

This invention relates to semiconductors and more particularly to the deposition of semiconductor layers thereon, normally of monocrystalline structure and with a controlled amount dopant.

2. Description of the Prior Art

In the manufacture of semiconductor devices, including monolithic or integrated structures, the epitaxial film forming technique is widely used for the extension of a semiconductor substrate, or by the addition of donor or acceptor impurities, for the formation of PN-junctions where a layer of one conductivity type semiconductor material is formed on a semiconductor substrate of a second conductivity type.

In epitaxial deposition processes, as employed in semiconductor processing, material is deposited on a monocrystalline substrate, of a like or similar base crystal, to form a monocrystalline layer whose orientation is determined by that of the substrate. A typical application of the epitaxial deposition processes involves the forming or growing of a silicon layer or film on a silicon substrate, commonly referred to as a wafer, utilizing the chemical reduction such as silicon tetrachloride by hydrogen in an atmosphere which can optionally contain a conductivity determining type of impurity as phosphorous, boron, arsenic, and the like, depending on the type of doping desired in the epitaxial film formed. For example, if an epitaxial film of a P/type silicon is desired, a boron compound such as $B_2H_6$ (Diborane) or $BBr_3$ (Boron tri-bromide) may be injected in the epitaxial growth atmosphere (normally premixed with the reducing gas, e.g. hydrogen) as an acceptor impurity. Conversely, if an N-type epitaxial film is desired, compounds of arsenic, phosphorous and the like, as for example, $AsH_3$ (Arsine), or $PH_3$ (Phosphene) may be injected in the epitaxial growth atmosphere. In general, however, the epitaxial crystal growth process is normally applicable to other semiconductors including germanium and Group III–V compounds such as gallium phosphide and gallium arsenide.

In a typical epitaxial deposition process, a silicon wafer substrate is supported on a susceptor within a quartz reactor tube wherein the wafer is heated by means of conduction heating from the susceptor which is heated by RF energy coupled to the susceptor. At operating temperatures, e.g. about 1,150° C., vapor phase silicon tetrachloride is carried through the reactor tube by hydrogen which may optionally contain a conductivity type impurity such as $PH_3$, $B_2H_6$, $AsH_3$, etc. At operating temperatures, the silicon tetrachloride is reduced by hydrogen, near the surface of the substrate, to silicon which it epitaxially deposits alone on the substrate or in conjunction with the dopant, if used.

However, such epitaxial growth processes, by the use of elevated temperatures, e.g., about 1,150° C are characterized by inherent disadvantages, as for example see U.S. Pat. No. 3,189,494. One such problem commonly called "autodoping" is of major concern in epitaxial processes utilizing flowing epitaxial atmospheres for deposition of epitaxial layers on heavily doped semiconductor substrates, and particularly where the epitaxial deposit contains a relatively small amount of dopant. At the elevated temperatures employed in epitaxial processes, e.g., about 1,150° C impurities diffuse out of more heavily doped substrates into the epitaxial atmosphere modifying the composition, thereof, with resultant undesired variations in the resistivities (and even conductivity type in extreme cases) in the substrate and epitaxial deposit. Where a flowing epitaxial atmosphere is employed, the gas stream is progressively enriched, as the impurity atoms diffuse out of the substrate, resulting in more heavily doped epitaxial deposits downstream of the gas flow with a corresponding variation in the resistivities of the final product. In applications involving epitaxial deposits on substrates of opposite conductivity type, this out diffusion results in compensation as well as resistivity variations.

The foregoing problem is particularly aggravated in a substrate having imbedded P- and/or N-regions on which the grown epitaxial layer is very much dependent. Here compensation or autodoping occurs more dramatically at the initial stages of epitaxial growth which can create an uncontrolled and undesired skin layer growth varying related geometries of the regions, impurity concentrations, epitaxial growth rates effective thickness thereof.

SUMMARY OF THE INVENTION

It has been found in accordance with this invention that "autodoping" or out-diffusion compensation of semiconductor materials deposited on doped semiconductor substrates can be substantially reduced, if not eliminated for practical purposes, by adaptation of well-known processing techniques. In its broadest concept, the invention comprehends the deposition on a semiconductor substrate of a primary or initial thin film of silicon by low temperature, e.g., of the order of 500° C or sputtering techniques, which in the preferred embodiment forms a continuation of the crystal orientation of the substrate. This sputtered film, optimally maintained in thickness range of about 1,000 to about 5,000 angstroms, is overlaid on the critical areas of the substrate to prevent out-diffusion of impurities therefrom during a subsequent normal epitaxial deposition at elevated temperatures where the growth rates can be readily adjusted so that the rate of deposition is greater than the out-diffusion of impurities from the substrate whose passage into the gas phase, and resultant cross-contamination, is constrained by the sputtered layer during epitaxial growth.

Accordingly, it is an object of this invention to provide a novel process for depositing semiconductor layers on semiconductor substrates.

It is also an object of this invention to provide a novel method for the deposition of semiconductor material on a like or similar base crystal.

A further object of this invention is to provide a novel method for depositing monocrystalline semiconductor material on a monocrystalline semiconductor substrate having a like or similar crystalline structure.

Another object of this invention is to provide a novel method for depositing a monocrystalline material of one conductivity type over the surface of monocrystalline semiconductor substrate containing a region of a second conductivity type and having a like or similar crystalline structure.

The foregoing and other objects, features, and advantages of the invention will be apparent from the following more particular description of the invention, in conjunction with the accompanying drawings.

DESCRIPTION OF THE PREFERRED EMBODIMENT

Figure 1:
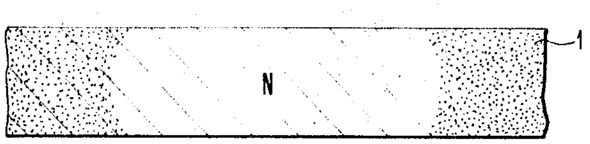
FIGS. 1 to 4 are partial sectional views illustrating various stages in the fabrication of a semiconductor structure utilizing one embodiment of this invention.

More specifically, as shown in the drawings, for purposes of illustrating the scope of applicant's invention, it is described with reference to an N-doped substrate 1 containing two embedded doped regions 2 and 3 which are N+ type and P+ type, respectively. As shown in FIG. 1, of this specific embodiment, substrate 1 is a monocrystalline silicon structure of about 8 mils thickness conventionally doped N− type to a resistivity of at least about 0.1 ohm-cm, and normally from about 0.005 to about 0.02 ohm-cm. Embedded in substrate 1 by conventional diffusion techniques is an N+ type region 2 and a P+ region 3. The diffusion in forming the N+ region 2 may be accomplished in conjunction with well-known masking techniques by employing N-type impurities such as arsenic or phosphorous as the diffusant to produce a high doping level which normally extends in the range of about $1 \times 10^{20}$ to about $1 \times 10^{21}$ atoms per cubic centimeter to provide a relatively low resistivity in the range of about $8 \times 10^{-4}$ to about $3 \times 10^{-4}$ ohm-cm. As shown, region 2 is of the same conductivity type as substrate 1 forming, by the variation in doping level, an N/N+ junction 4 which may, in one form, be employed as a through-channel in complex integrated circuits.

Conversely, the P+ region 3 defining the P/N junction 5 may be formed, also in conjunction with masking techniques, by diffusion employing P− type impurities such as boron as the diffusant to produce a relatively high doping level which normally extends in the range of about $2 \times 10^{20}$ atoms per cubic centimeter to provide a corresponding low resistivity region in the range of about $7 \times 10^{-4}$ ohms-cm. As shown, the P+ doped region 3 is of a conductivity type opposite to the conductivity of substrate 1, which in one form may comprise a capacitor in complex integrated devices. As will be understood, the foregoing illustrates the general applicability of the invention regardless the type or configuration of substrate employed. For example, the substrate may be devoid of doped regions 2 and 3, and thus merely comprise a doped region of one conductivity type on which is to be deposited semiconductor material of a second conductivity type to define a P/N junction. Also, either type of doped regions 2 and 3 may be employed alone to the exclusion of the other type. In its broadest context the invention is also directed to deposition of doped semiconductor materials on a semiconductor substrate of the same conductivity type.

Figure 2:
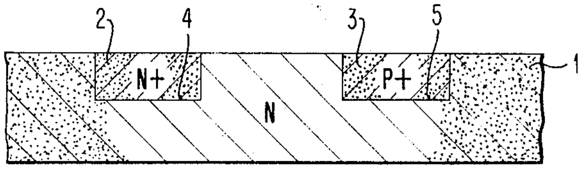
Figure 3:
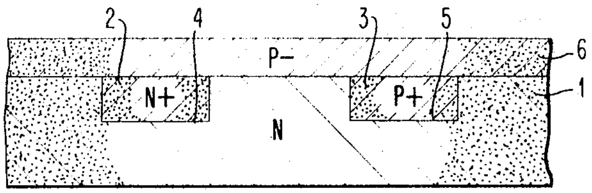

In the next stage of the process as shown in FIG. 3, a thin film 6 of silicon (preferably undoped in this embodiment) is deposited by appropriate control of well-known sputtering techniques (such as disclosed in U.S. Pat. No. 3,021,271) which in the preferred form provides a high resistivity layer 6 having a monocrystalline orientation forming a continuation of the monocrystalline orientation of substrate 1. The particular method is not critical, and the deposition may be performed by the process described in this U.S. Pat. No. 3,021,271, (to which reference can be made for additional details of the process). In general, as described in this patent, the silicon substrate 1 of FIG. 2 and a silicon depositor are both subjected to a preliminary ionic bombardment in order to remove contaminating materials therefrom followed by subsequent sputtering, at temperatures of the order of 300° to 500° C to deposit a like crystallographically compatible crystalline material on the crystalline substrate.

Typically, the high resistivity film 6 may be formed with a dopant such as boron, in an impurity concentration in the range of about $2 \times 10^{14}$ to about $10^{16}$ atoms per cc. to provide resistivities in the range of 100 to 1 as shown in FIG. 3, which are substantially higher than the resistivity of the P+ region 3. Similarly, N-type dopants can be used if overcompensation from the P+ region is desired.

The thickness of the sputtered P− film is preferably relatively small and which normally is in the range of about 1,000 to about 5,000 angstroms. However, in view of the relatively slow rate of deposition attainable by sputtering technique, e.g., about 0.5 microns per hour), the thickness of the deposit obtained by sputtering will normally be just sufficient to prevent out-diffusion of dopants from the substrate during subsequent higher temperature deposition by epitaxial growth techniques. The thickness of the deposited film will also be dependent on the relative areas of the embedded N+ 2 and P+ 3 regions, their separation distance, and the relative impurity concentrations of the regions 2,3, and 1. Generally, increased autodoping effects are caused by greater doped areas, closer spaced regions, and higher impurity doping concentrations.

As will be appreciated, since diffusion rates vary exponentially with associated temperature, the deposition of the P− film 6 by low temperature sputtering effectively lowers out-diffusion of impurities from the substrate. Also, since it is performed in the absence of epitaxial atmospheres, the problem of contamination and autodoping is absent.

Figure 4:
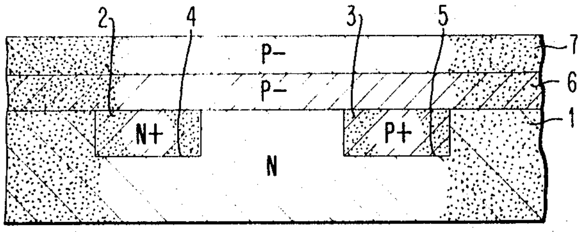

In the following stage, as shown in FIG. 4, the sputtered P− film 6 is overlaid with an epitaxially deposited P− layer 7 of, normally, the same conductivity type having substantially the same level of impurity concentrations and resistivities.

The particular epitaxial growth method for use in the invention is not critical and any of the known methods may be employed. Typically, for this embodiment, the substrates may be supported on graphite susceptors within a quartz reactor tube of about 4 inches ID. The susceptor (and the substrates thereon) are inductively heated by coupling with an R.F. coil to a temperature of 1,150° C (and normally between about 1,000° to about 1,200° C) while passing hydrogen through the reactor to ensure complete removal and absence of oxides and surface contaminants. Thereafter, a feed gas formed, by volume, of 99.5 percent hydrogen, 0.5 percent silicon tetrachloride and a controlled trace (less than 1 ppm) of a dopant such as diborane is passed through the reactor and over the substrates at ambient temperature and at a rate of about 30 liters per minute until the desired thickness of the epitaxial crystal layer is deposited, which for practical purposes can normally extend in the range of about 1 to about 5 microns. To obtain a 2 micron thick epitaxial P− layer 7 as shown in FIG. 4, the stream of feed gas through the reactor was maintained for about 10 minutes.

The pressure in the reactor is substantially atmosphere at constant temperature which for epitaxial deposition of silicon is normally maintained between about 1,100° C and 1,200° C. Conversely for epitaxial deposition of germanium on a monocrystalline substrate thereof, the deposition temperatures will normally be maintained between about 700° to about 900° C.

As will be understood, where undoped epitaxial layers are desired, the dopant will be omitted from the feed gas; and conversely if an N-type epitaxial layer is desired a corresponding type of conductivity determining impurity, such as Phosphine or arsine may be added to the feed gas. In general, various dopant concentrations can be employed depending upon the desired characteristics of the deposited epitaxial layer.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating semiconductor devices including the steps of:
   - sputtering on a major surface of a semiconductor substrate, in a substantially continuous extension of the crystal orientation thereof and at a low temperature of the order of 500° C, a first cohesive layer of a semiconductor material; and
   - epitaxially growing a second cohesive layer of a semiconductor material over and contiguous with said first layer wherein said substrate comprises a semiconductor material of a first conductivity type, and both said first and second layers comprise semiconductor materials of an opposite conductivity type.

2. A method of fabricating semiconductor devices including the steps of:
   - forming in a semiconductor substrate of a first conductivity type a diffused region of an opposite conductivity type with said region disposed adjacent a major surface of and spaced from the lateral edges of said substrate;
   - sputtering, at a low temperature of the order of 500° C, over said surface in a substantially continuous extension of the crystal orientation of said substrate, a first cohesive layer of semiconductor material coextensive with said region and adjacent portions of said surface; and
   - epitaxially growing a second cohesive layer of semiconductor material over and contiguous with said first layer wherein both said first and second layers comprise a semiconductor material of said first conductivity type.

3. A method of fabricating semiconductor devices including the steps of:
   - forming in a semiconductor substrate of a first conductivity type a diffused region of an opposite conductivity type with said region disposed adjacent a major surface of and spaced from lateral edges of said substrate;

sputtering, at a low temperature of the order of 500° C, over said surface in a substantially continuous extension of the crystal orientation of said substrate, a first cohesive layer of semiconductor material coextensive with said region and adjacent portions of said surface; and epitaxially growing a second cohesive layer of semiconductor material over and contiguous with said first layer wherein both said first and second layer comprise a semiconductor material of said opposite conductivity type.

4. A method of fabricating semiconductor devices including the steps of:

forming through a major surface of a first conductivity type semiconductor substrate and spaced from the lateral edges thereof, a first diffused region of an opposite conductivity type;

forming in said substrate through said surface and spaced from said first region a second diffused region of said first conductivity type having a resistance substantially less than said substrate;

sputtering at a low temperature of the order of 500° C, on said substrate in a substantial continuous extension of the crystal orientation thereof, a first cohesive layer of semiconductor material coextensive with and overlying said first and second regions and adjacent portions of said surface; and epitaxially growing a second layer of semiconductor material over and contiguous with said first layer, wherein said first and second layers comprise a semiconductor material of said first conductivity type.

5. A method of fabricating semiconductor devices including the steps of:

forming through a major surface of a first conductivity type semiconductor substrate and spaced from the lateral edges thereof, a first diffused region of an opposite conductivity type;

forming in said substrate through said surface and spaced from said first region a second diffused region of said first conductivity type having a resistance substantially less than said substrate;

sputtering, at a low temperature of the order of 500° C, on said substrate in a substantial continuous extension of the crystal orientation thereof, a first cohesive layer of semiconductor material coextensive with and overlying said first and second regions and adjacent portions of said surface; and epitaxially growing a second layer of semiconductor material over and contiguous with said first layer, wherein said first and second layers comprise a semiconductor material of said opposite conductivity type.

6. The method of claim 5 wherein said first and second layers comprise a semiconductor material having a resistivity substantially higher than said first region.

* * * * *